(12) United States Patent
Roohparvar

(10) Patent No.: US 10,048,882 B2
(45) Date of Patent: Aug. 14, 2018

(54) NON-VOLATILE MEMORY WITH LPDRAM

(71) Applicant: MICRON TECHNOLOGY, INC., Boise, ID (US)

(72) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 14/939,076

(22) Filed: Nov. 12, 2015

(65) Prior Publication Data

US 2016/0062695 A1 Mar. 3, 2016

Related U.S. Application Data

(62) Division of application No. 12/018,550, filed on Jan. 23, 2008, now Pat. No. 9,196,346.

(51) Int. Cl.
*G06F 12/00* (2006.01)
*G06F 3/06* (2006.01)
*G06F 12/02* (2006.01)
*G11C 11/406* (2006.01)
*G06F 13/40* (2006.01)

(52) U.S. Cl.
CPC .......... *G06F 3/0634* (2013.01); *G06F 3/0625* (2013.01); *G06F 3/0685* (2013.01); *G06F 12/023* (2013.01); *G06F 13/4068* (2013.01); *G11C 11/406* (2013.01); *G11C 11/40615* (2013.01); *Y02D 10/14* (2018.01); *Y02D 10/151* (2018.01)

(58) Field of Classification Search
CPC ... G06F 3/0634; G06F 13/4068; G06F 12/023
See application file for complete search history.

(56) References Cited

U.S. PATENT DOCUMENTS

| 7,030,488 B2 | 4/2006 | Kiss |
| 2003/0072206 A1 | 4/2003 | Chen |
| 2005/0204091 A1 | 9/2005 | Kilbuck et al. |
| 2008/0065814 A1* | 3/2008 | Cornwell ............ G06F 9/4411 711/103 |

* cited by examiner

*Primary Examiner* — Jae Yu
(74) *Attorney, Agent, or Firm* — Dicke, Billig & Czaja, PLLC

(57) ABSTRACT

Low power DRAM (LPDRAM) memory devices for communication with a non-volatile memory coupled to the LPDRAM memory device, and systems containing such LPDRAM and non-volatile memory facilitate configuring the LPDRAM memory device using routines stored on the non-volatile memory.

20 Claims, 6 Drawing Sheets

NON-VOLATILE MEMORY WITH LPDRAM

RELATED APPLICATIONS

This application is a Divisional of U.S. patent application Ser. No. 12/018,550 filed Jan. 23, 2008 now U.S. Pat. No. 9,196,346, issued on Nov. 24, 2015, which is commonly assigned and incorporated herein by reference in its entirety.

TECHNICAL FIELD

The present embodiments relate generally to memory and in particular to non-volatile memory, such as Flash memory, and Low Power DRAM (LPDRAM) memory devices.

BACKGROUND

Memory devices are typically often provided as internal storage areas in a computer, such as in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM (read-only memory), which permits you only to read data. Most RAM is volatile, which means that it requires a steady flow of electricity to maintain its contents. As soon as the power is turned off, whatever data was in RAM is lost, whereas ROM is non-volatile and retains its data when power is lost.

Dynamic RAM (DRAM) and synchronous DRAM (SDRAM) are types of RAM wherein the data is typically stored as individual charges (or lack thereof) placed in memory cells formed from capacitors coupled to select gate transistors in the DRAM memory array. To access and read the data the select gates coupled to the selected memory cells are activated and the charge stored on the associated memory cell capacitors are coupled to bit lines and the stored values are read by sense amplifiers. As this data read removes the charge stored in the selected memory cell capacitors the data must then be rewritten back into the selected cells so that it is available for any future access. In addition, as the memory cell capacitors typically slowly leak charge, the charges on the capacitors of the array must be periodically refreshed by being read and written back into the cell in a refresh operation, maintaining the data contents. This refresh operation can be executed either by the host, typically a processor or memory controller coupled to the memory, or by an onboard controller or control state machine of the DRAM in a "self-refresh" operation.

Low Power Dynamic Random Access Memory (LP-DRAM) and Low Power Synchronous Dynamic Random Access Memory (LPSDRAM), both referred to herein as LPDRAM, are similar in operation and structure to conventional asynchronous and synchronous DRAM devices, but includes features designed to reduce power consumption in several modes of operation and/or adjustments. In particular, the operation of self-refresh mode of a DRAM can draw a relatively high amount of power to refresh the data in its memory array. As a result, LPDRAM allows for the adjustability of the self-refresh operation and, in particular, its repetition rate (also known as the repetition frequency), through any of a variety of mechanisms to allow the power draw of this operation to be reduced in LPDRAM. Because of this, LPDRAM is typically utilized in battery powered or other low power environments.

A problem in modern LPDRAM memory devices is that configuring a LPDRAM for low power operation, is difficult and highly dependent on the environmental conditions internal and external to the LPDRAM. In particular, the selection of the self-refresh timing and repetition frequency is highly dependent on the operating temperature of the LPDRAM and the available power supply voltage in establishing the settings and repetition frequency that maximizes power savings and yet still maintains the data state of the memory cells. Conventional DRAM memory devices avoid this problem by utilizing higher power usage settings, such as by refreshing at a rate higher than required for the memory operating environment and temperature. Because of this sensitivity, configuration of the LPDRAM is typically done by the controller or processor coupled to the LPDRAM utilizing routines, which as used here can include linkable libraries given to the designer/end-user/system manufacturer by the LPDRAM manufacturer. These routines are typically supplied in a source code format or as a linkable library and, as such, must be compiled into the operating system or overall code executing on the device. As these routines add complexity to the system design process and operating software they add additional design and testing complexity, and if not implemented correctly can cause data corruption and/or system failure, in particular, when the system is operating in extreme environmental conditions, such as in extreme voltages and temperatures. In addition, these LPDRAM routines can also differ by manufacturer, LPDRAM type and/or revision, causing potential issues with future compatibility and parts availability as new LPDRAMs are developed.

For the reasons stated above, and for other reasons stated below which will become apparent to those skilled in the art upon reading and understanding the present specification, there is a need in the art for alternative methods of configuring LPDRAM memory devices and arrays.

DETAILED DESCRIPTION

Figure 1:
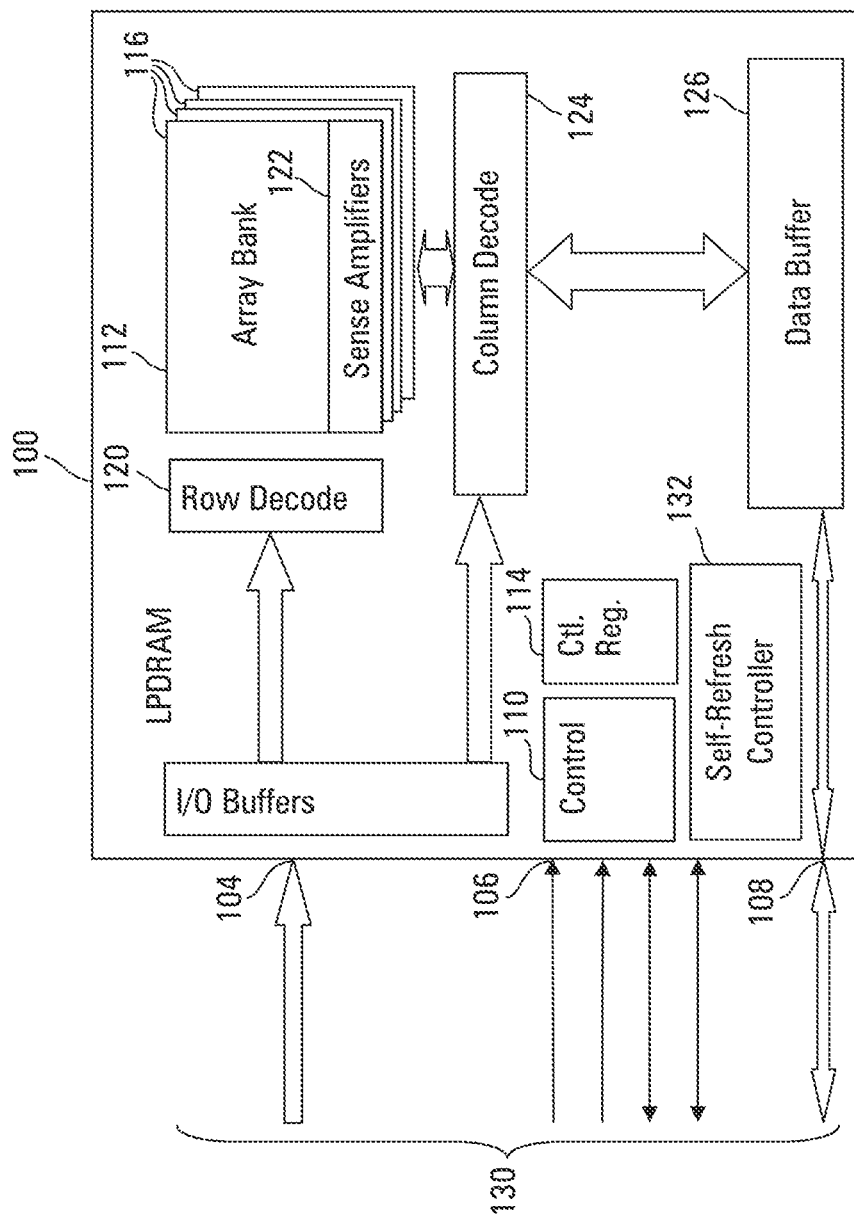
FIG. 1 is a simplified block diagram of a LPDRAM in accordance with an embodiment of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

One or more embodiments of the present invention include non-volatile memory devices (or subsystems utilizing such devices) that are paired with an associated volatile memory, such as a LPDRAM memory device, wherein the LPDRAM is configured by executing routines stored in the non-volatile memory on a controller or state machine of either the LPDRAM or non-volatile memory. This allows the configuration of the LPDRAM to be self contained in the non-volatile memory device/LPDRAM memory pairing and occur under the control of the local controller or state machine utilizing the stored LPDRAM configuration routines. This enables the system designer to avoid having to configure the LPDRAM with the system processor or having to compile in manufacturer provided LPDRAM routines into the operating system or embedded application of the system, simplifying the design process and increasing system reliability by eliminating possible misconfiguration of the LPDRAM or the routines by the system designer. One or more embodiments of the present invention also allow for increased forward compatibility of the system and operating system (OS) with future LPDRAM devices and revisions by moving LPDRAM configuration out of the OS and off the processor. New LPDRAM devices or versions or routines to be utilized can be managed through updates to the non-volatile memory routines or devices and do not require new routines to be compiled into the OS and the OS image retested. One or more embodiments of the present invention are particularly advantageous with NAND architecture Flash memory devices that utilize an onboard controller or state machine of the NAND architecture Flash memory device and stored configuration routines to configure and control a LPDRAM paired with the NAND Flash memory (e.g., either directly coupled or coupled indirectly in the same system).

As stated above, LPDRAM devices are typically similar in operation and structure to conventional DRAM devices and often have the same functionality as a standard DRAM, except they have been designed to have a lower standby current and adjustable low power refresh. In LPDRAM, as with DRAM, the individual memory bit cell typically contains a capacitor coupled to a select gate transistor and the data is typically represented as a charge (or lack thereof) stored in a memory cell capacitor. These memory cells are generally arranged in an array matrix of rows and columns, with each cell coupled to a column bit line. The cells are then activated in rows by coupled word lines to output their stored charges (representing data values) on to the bit lines. However, LPDRAM also includes features designed to reduce power consumption, in particular, while the LPDRAM is in standby mode and also through the adjustment of timing of the self-refresh mode of operation. As noted above, while conducting a refresh operation, the memory can require a relatively high amount of power to refresh the data in its memory array. Because of this, LPDRAM is typically utilized in battery powered or other low power environments in conjunction with other low power memory types, such as non-volatile Flash or EEPROM memory.

FIG. 1 details a simplified diagram of a LPDRAM memory device 100. The LPDRAM 100 has a memory interface 130 having a control interface 106, an address interface 104, and a data interface 108 to allow the LPDRAM to be connected to a bus and/or a host, such as a processor or a memory controller. It is noted that in other embodiments, the memory interface 130 can be synchronous or asynchronous and/or have the address interface 104 and data interface 108 merged into a single address/data interface. Internal to the LPDRAM 100, a controller 110, such as a control state machine or control circuit, directs the internal operation; managing the LPDRAM memory array 112 and updating RAM control registers 114. The RAM control registers and tables 114 are utilized by the control state machine 110 during operation of the LPDRAM memory 100. The LPDRAM memory array 112 contains a sequence of memory banks 116. Memory access addresses are received on the address interface 104 of the LPDRAM 100 and divided into a row and column address portions. On a read access, the row address is latched by the interface I/O buffer and decoded by row decode circuit 120, which selects and activates a row page (not shown) of memory cells across a selected memory bank, such as by enabling the memory cell select transistors. The bit value charges stored in the capacitors of the selected memory cells are coupled through a local bit line (not shown) to a global bit line (not shown) to be detected by sense amplifiers 122 associated with the memory bank. The column address of the access is also latched by the interface I/O buffer and decoded by the column decode circuit 124. The output of the column decode circuit selects the desired column data from the sense amplifier outputs which are then coupled to the data buffer 126 for transfer from the memory device through the data interface 108. It is noted that in one embodiment of the present invention, the column decode 124 may be optionally placed between the memory array 112 and the sense amplifiers 122. Once read by the sense amplifiers 122, the data is typically then rewritten back into the selected memory cells to restore or refresh the data stored in the form of charges in the capacitors of the selected memory cells. On a write access the row decode circuit 120 selects the row page and column decode circuit selects write sense amplifiers 122. Data values to be written are then connected from the data buffer 126 to the write sense amplifiers 122 selected by the column decode circuit 124 and written to the selected memory cells (not shown) of the memory array 112.

In self-refresh mode, the self-refresh control circuit 132 refreshes the data by refreshing the stored charges in the capacitors of the memory cells before the data becomes unreadable through charge leakage from the memory cell capacitors. This self-refresh operation is typically done by sequentially reading each row of the memory array and substantially immediately writing the data back into the cells of the accessed rows to restore the charge levels to their original values. To do this, the self-refresh control circuit 132 typically disables access to the memory and controls the operation of the address decoders 120, 124 to select the row/column addresses of the memory locations to be refreshed utilizing the system clock or a local refresh oscillator (typically utilized while in a low power stand-by mode without access to the system clock) a refresh timer, and a refresh counter (to sequentially address the rows of the array). Typically each row to be refreshed is selected and the memory cells of the columns of that row are sensed and refreshed in a single simultaneous operation (although different pages of columns or the row can also be refreshed individually to lower the instantaneous power draw). The whole memory array or, alternatively, individual banks are generally refreshed in the refresh operation. It is noted that there are other possible manners of refreshing the rows of a LPDRAM or DRAM memory array, including, but not limited to, interleaving the refresh operation between accesses, and sequential refresh of memory banks or memory segments are possible in DRAM and LPDRAM devices and will be apparent to those skilled in the art.

As charge leakage is typically dependent on environmental conditions, such as the number of accesses occurring, supply voltage, and ambient temperature, the self-refresh of the LPDRAM is generally adjustable in frequency and timing to maximize the efficiency of the refresh operation. In addition, the refresh operation is typically also adjusted for differing modes of operation, such as in a low power or stand-by mode, where accesses to the LPDRAM and available power are minimal or disabled, lowering the need for refresh. LPDRAMs typically also have other configuration settings and modes of operation, including, but not limited to, refresh style (interleaved, partial column, full array, bank refresh, etc.), voltage level selection, stand-by mode operation, and memory timings that can be adjusted to control the power usage of the LPDRAM and will be apparent to those skilled in the art with the benefit of the present disclosure.

As also stated above, computers almost always contain a small amount of read-only memory (ROM) that holds instructions for starting up the computer. Unlike RAM, ROM cannot be written to. Memory devices that do not lose the data content of their memory cells when power is removed are generally referred to as non-volatile memories. EEPROM (electrically erasable programmable read-only memory) and Flash memory are special types non-volatile ROMs that can be erased by exposing their memory cells to an electrical charge. EEPROM and Flash memory comprise a large number of memory cells having charge storage nodes, such as electrically isolated gates (also known as floating gates). Data is stored in the memory cells in the form of charge on the floating gates. A typical floating gate memory cell is fabricated in an integrated circuit substrate and includes a source region and a drain region that is spaced apart from the source region to form an intermediate channel region. A conductive floating gate, typically made of doped polysilicon, or non-conductive charge trapping layer (a floating node, another form of charge storage node), such as nitride (as would be utilized in a silicon-oxide-nitride-oxide-silicon or SONOS gate-insulator stack), is disposed over the channel region and is electrically isolated from the other cell elements by a dielectric material, typically an oxide. Charge is transported to or removed from the floating gate or trapping layer by specialized programming and erase operations, respectively, altering the threshold voltage of the device.

A typical Flash memory also typically comprises a memory array of floating gate memory cells. However, in Flash memory, the cells are usually grouped into sections called "erase blocks." Each of the cells within an erase block can be electrically programmed by tunneling charges to its individual floating gate/node. Unlike programming operations, however, erase operations in Flash memories typically erase the memory cells in bulk erase operations, wherein all floating gate/node memory cells in a selected erase block are erased in a single operation. It is noted that in recent Flash memory devices multiple bits have been stored in a single cell by utilizing multiple threshold levels or a non-conductive charge trapping layer with the storing of data trapped in a charge near each of the sources/drains of the memory cell FET.

EEPROM and Flash also typically arrange their arrays of non-volatile memory cells in either a NOR (similar to a conventional RAM or ROM array) or NAND architecture array configuration. It is noted that other non-volatile memory array architectures exist, including, but not limited to AND arrays, OR arrays, and virtual ground arrays. In a NOR memory array architecture the memory array is arranged in a matrix of rows and columns, with each cell directly coupled to a column bit line. The cells are then activated in rows by coupled word lines to output their stored data value charges on to the bit lines. In a NOR architecture array utilizing floating gate memory cells, the gates of each non-volatile memory cell of the array are coupled by rows to word lines (WLs), each memory cell is coupled to a source line and a column bit line.

NAND array architecture arranges its array of non-volatile memory cells in a matrix of rows and columns, as a conventional NOR array does, so that the gates of each non-volatile memory cell of the array are coupled by rows to word lines (WLs). However, unlike NOR, each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity. Because of their complexity, non-volatile memory devices, such as NAND and NOR architecture Flash memory devices, typically have dedicated external and/or internal memory controllers and state machines to manage their internal operation.

Because all the cells in a block based non-volatile memory device, such as a Flash memory device, must be erased all at once, one cannot directly rewrite a Flash memory cell without first engaging in a block erase operation. Erase block management (EBM), typically a function of a Flash memory controller or driver, provides an abstraction layer for this to the host (a processor or an external memory controller), allowing the Flash device to appear as a freely rewriteable device, including, but not limited to, managing the logical address to physical erase block translation mapping for reads and writes, the assignment of erased and available erase blocks for utilization, and the scheduling erase blocks that have been used and closed out for block erasure. Erase block management also allows for load leveling of the internal floating gate memory cells to help prevent write fatigue failure. Write fatigue is where the floating gate memory cell, after repetitive writes and erasures, no longer properly erases and removes charge from the floating gate. Load leveling procedures increase the mean time between failure of the erase block and Flash memory device as a whole.

Figure 2:
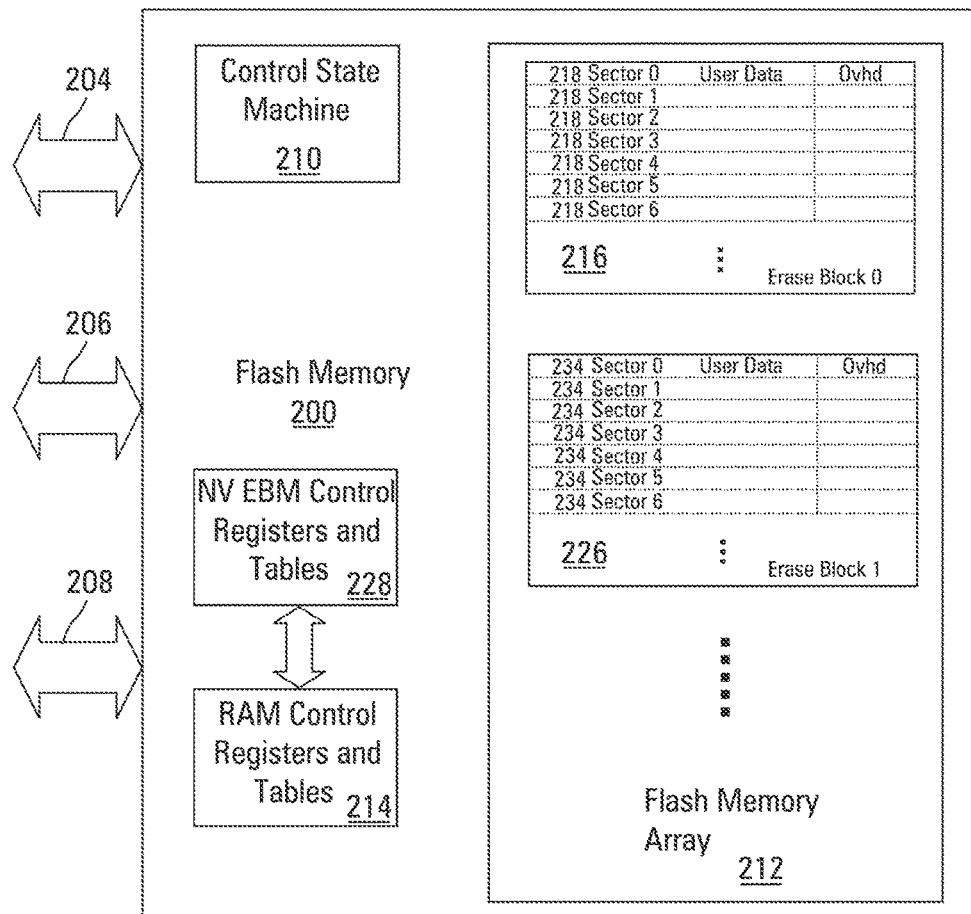
FIG. 2 is a simplified block diagram of a non-volatile memory device in accordance with an embodiment of the present invention.

FIG. 2 is a simplified diagram of a Flash memory device 200. In FIG. 2, the Flash memory 200 can be coupled to a system bus, a processor, or a memory controller with an interface having an address interface 204, control interface 206, and data bus 208. Internally to the Flash memory device, a control state machine 210 directs internal operation of the Flash memory device; managing the Flash memory array 212 and updating RAM control registers and tables 214. The floating gate memory cells of the Flash memory array 212 (NAND or NOR) are typically arranged in rows and columns and are accessed utilizing row and column address decoders (not shown). Once a row is activated the memory cells place their data values onto coupled bit lines/strings to be carried to sense amplifiers to be sensed (not shown). The data to be read is then selected from the sense amplifiers by the column decoder to be read from the Flash memory device 100 through the data interface 208. The non-volatile floating gate memory cells of the Flash memory array 212 are also logically formed into erase blocks 216, 226. Each erase block 216, 226 contains a series of sectors 218, 234 that are typically 512 bytes long and contain a user data space and a control/overhead data space. In some Flash memory devices, multiple sectors are arranged on each row of the memory array. The overhead data space contains overhead information for operation of the sector, such as an error correction data code (ECC, not shown), status flags, or erase block management data (not shown). The RAM control registers and tables 214 are loaded at power up from the non-volatile erase block management registers and tables 228 by the control state machine 210. It is noted that other forms and formats of Flash memory devices 100 are possible and will be apparent to those skilled in the art with benefit of the present disclosure.

Figure 3:
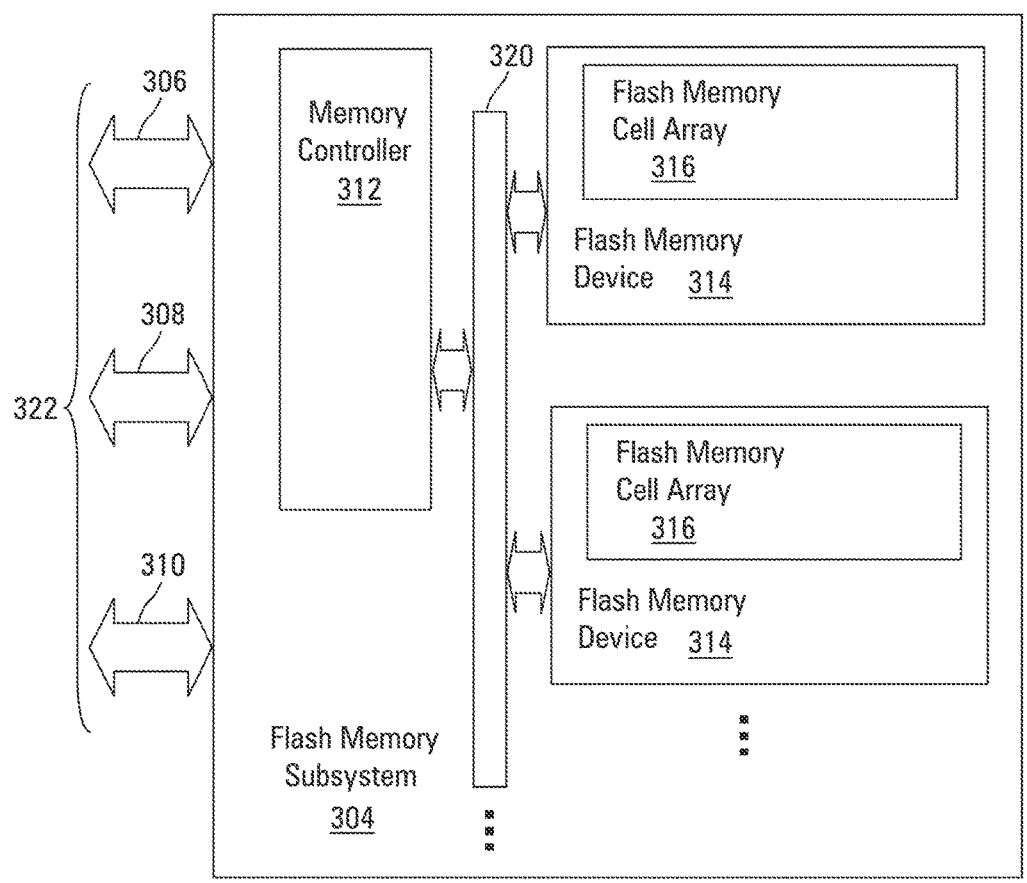
FIG. 3 is a simplified block diagram of a non-volatile memory subsystem in accordance with an embodiment of the present invention.

FIG. 3 is a simplified diagram of a Flash memory subsystem 304, such as a Flash memory card or module, having one or more Flash memory devices (such as NAND architecture Flash memory devices) 314 internal to it. In FIG. 3, the Flash memory subsystem 304 can be coupled to a bus, a processor, or anther host with an interface 322 having an address 306, control 308, and data bus 310. Internal to the Flash memory subsystem 304, the memory controller 312 controls operation of the Flash memory subsystem 304 and presents the Flash memory subsystem 304 as a unitary memory device (such as a hard drive) through the interface 322. The memory controller 312 is coupled to and controls one or more Flash memory devices 314 via an internal bus 320; controlling the specialized Flash memory interfacing and interaction with the one or more Flash memory devices 314, including, but not limited to, accessing the Flash memory devices 314, address abstraction, mapping bad blocks, generating and evaluating ECCs, erase block management, wear leveling, block erasure, writing data to the Flash memory devices 314. The Flash memory devices 314 include Flash memory cell arrays 316.

As stated above, one or more embodiments of the present invention include non-volatile memory devices (such as a Flash memory device) that are paired with one or more LPDRAM memory devices or arrays and manage the configuration of the LPDRAM by utilizing a controller or state machine of the either the LPDRAM or non-volatile memory to execute the routines stored in the non-volatile memory. This allows the configuration of the LPDRAM, such as its power and self-refresh settings, to be self contained and occur under the local control of a controller or state machine utilizing the stored LPDRAM configuration routines and eliminates the need for the system designer to have to account for and configure the LPDRAM with the system processor/operating system. This simplifies the design process and increases system reliability by eliminating the possibility of mis-implementation of the routines or misconfiguration of the LPDRAM by the system designer. One or more embodiments of the present invention also allow for increased forward compatibility of systems with future LPDRAM devices and/or revisions by allowing this localized LPDRAM configuration in the non-volatile memory/LPDRAM pairing. New LPDRAM devices can then be managed through use of updates to the non-volatile memory routines or use of the appropriate matching type of non-volatile device and do not require new routines to be configured and compiled into the OS.

Figure 4A:
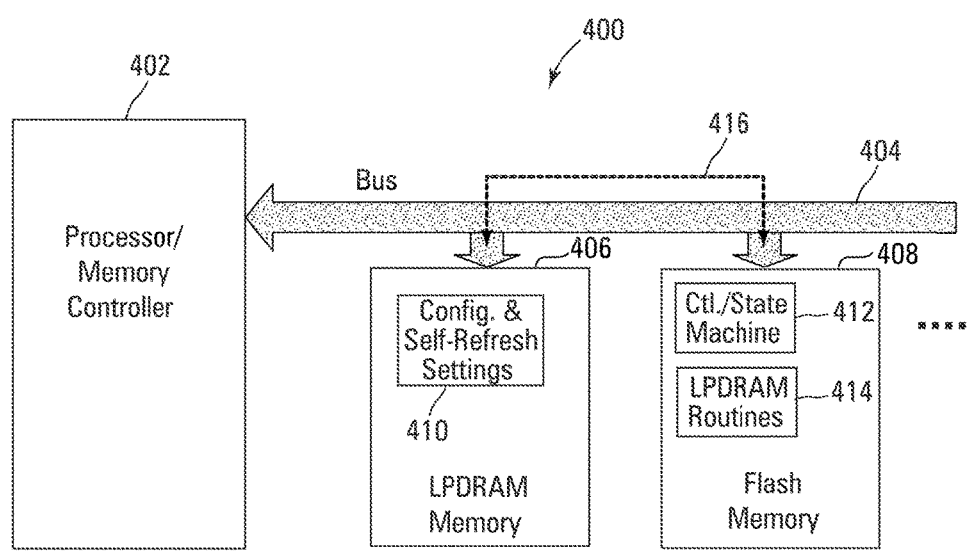
FIGS. 4A-4C are simplified block diagrams of systems containing LPDRAM and non-volatile memory devices in accordance with embodiments of the present invention.

FIG. 4A is a simplified diagram of a system 400 embodiment of the present invention incorporating a non-volatile memory device, such as a NAND architecture Flash memory 408, and a LPDRAM 406 coupled to host 402, such as a processor or a memory controller, through a bus 404, that can be either synchronous or asynchronous in nature. In the system 400 of FIG. 4A, a controller 412, such as a control circuit or state machine, of the Flash memory 408 controls operation of the Flash memory 408 and, utilizing the LPDRAM configuration routines 414 stored on the Flash memory device 408, also communicates 416 through the bus 404 to the LPDRAM 406 to configure the low power and self-refresh settings 410 of the LPDRAM 406 to match the environmental conditions. In this, the Flash memory 408 can either share access to the bus 404 with the host 402 and/or other devices coupled to the bus, interleaving its communication in with the other activity on the bus, or, alternatively, the Flash memory 408 and controller 412 can take over control of the bus 404, as the bus master, until sensing of conditions on the LPDRAM 406 and its subsequent configuration are complete. In various embodiments, to facilitate this communication and assist the controller 412 in locating the LPDRAM, the Flash memory 408 can either be configured with the address of the LPDRAM 406 in the system, place a token on the bus that the LPDRAM 406 is programmed to recognize and respond to, initiate a query/response protocol to locate the LPDRAM(s) 406 of the system, or have a specific chip select dedicated to the LPDRAM(s) 406 it configures. It is noted that the Flash memory 408 of the system 100 can also be a Flash memory subsystem, such as a module or a memory card, with one or more Flash memory devices and a dedicated Flash memory controller. It is also noted that in various embodiments, in addition to the configuration routine, configuration settings for the LPDRAM(s) 406 and/or an initial data set to be written to the LPDRAM(s) 406 for use by the system 400 can also be stored in the Flash memory 408 and used by the controller 412 in configuration and/or communicated across the bus 404 to the LPDRAM(s) 406.

Figure 4B:
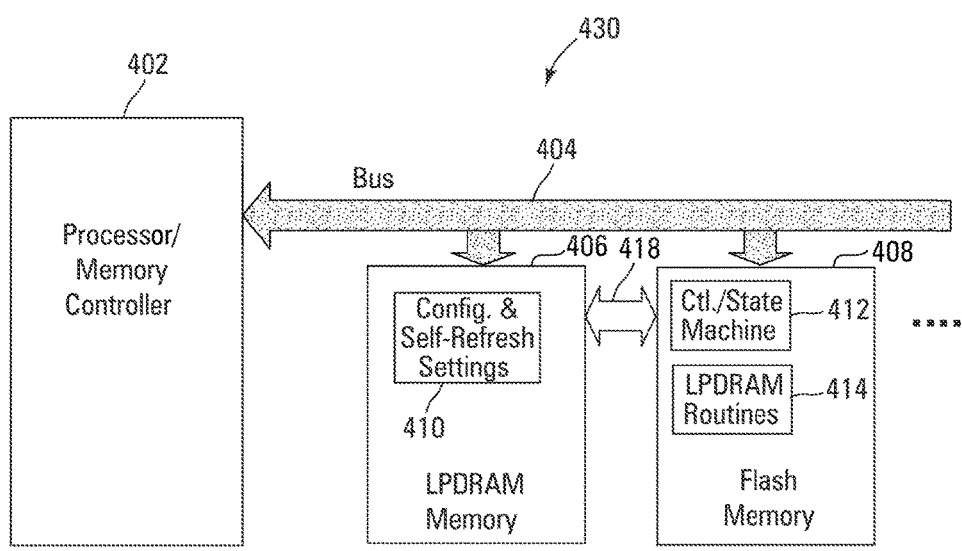

FIG. 4B is another simplified diagram of a system 430 embodiment of the present invention incorporating a non-volatile memory device, such as a NAND architecture Flash memory 408, and a LPDRAM 406 coupled to a host 402 through a bus 404. In the system 430 of FIG. 4B, a dedicated LPDRAM/Flash bus 418, which is separate from the system bus 404, couples the Flash memory device 408 and the LPDRAM 406. The controller 412, such as a control circuit or state machine, of the Flash memory 408 communicates through the dedicated LPDRAM configuration bus 418 to the LPDRAM 406 and, utilizing the LPDRAM configuration routines stored on the Flash memory device 408, configures the low power and self-refresh settings of the LPDRAM 406 to match the environmental conditions. This allows the Flash memory 408 to avoid having to share access to the bus 404 with the host 402 and other devices coupled to the bus with the resulting LPDRAM 406 addressing and bus sharing protocol complications, thus simplifying system configuration. In one embodiment of the present invention, the dedicated LPDRAM configuration bus 418 is a single conductor based serial bus.

Figure 4C:
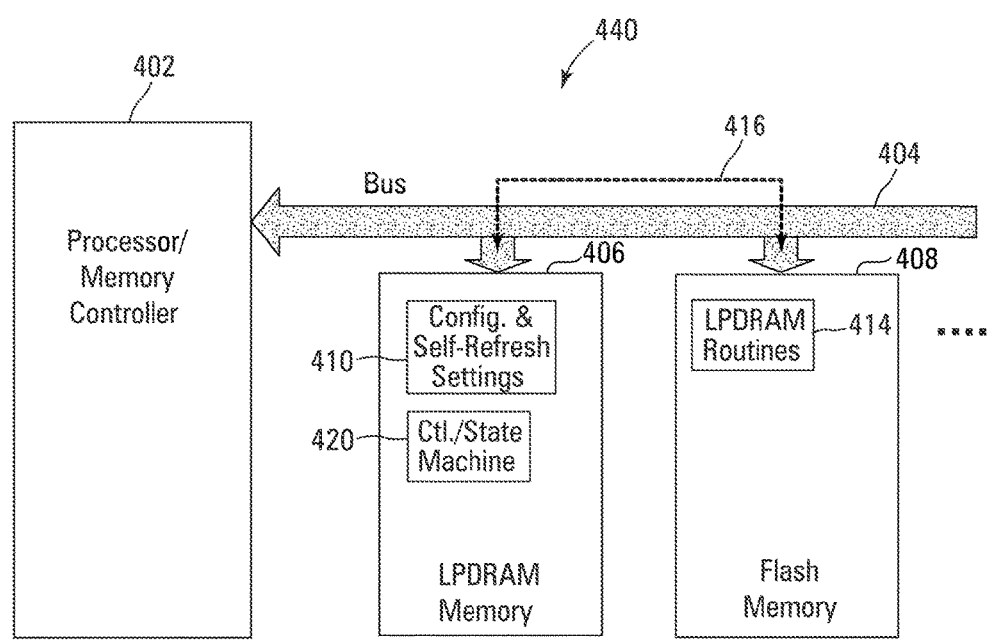

FIG. 4C is another simplified diagram of a system 440 embodiment of the present invention incorporating a non-volatile memory device, such as a NAND architecture Flash memory 408, and a LPDRAM 406 coupled to a host 402 through a bus 404. In the system 440 of FIG. 4C, however, the controller 420 configuring the LPDRAM 406 is located in the LPDRAM memory device 406 instead of the Flash memory 408. In the system 440 of FIG. 4C, the control circuit or state machine 420 of the LPDRAM 406 also communicates 416 through the bus 404 to the Flash memory 408 and, utilizing the LPDRAM configuration routines stored on the Flash memory device 408, configures the low power and self-refresh settings of the LPDRAM 406 to match the environmental conditions. In this embodiment, the LPDRAM 406 can either share access to the bus 404 with the host 402 and other devices coupled to the bus, interleaving its communication in with the other activity on the bus. Alternatively, the LPDRAM 406 and controller 420 can take over control of the bus 404 until configuration is complete. To facilitate this communication, the LPDRAM 406 can be configured with the address of the Flash memory 408, place a token on the bus that the Flash memory 408 is programmed to recognize and respond to, initiate a query/response protocol to locate the Flash memory 408, or have a specific chip select dedicated to the Flash memory 408 that stores its configuration routines. It is also noted that a dedicated LPDRAM/Flash memory bus can also be utilized to avoid sharing the main system bus 404.

It is noted that other formats and configuration of a non-volatile memory device and paired LPDRAM device of embodiments of the present invention are possible and will be apparent to those skilled in the art with benefit of the present disclosure.

CONCLUSION

Systems and methods have been described where a non-volatile memory device (such as a Flash memory device) is paired with one or more LPDRAM memory devices or arrays and configures the LPDRAM by utilizing routines stored in the non-volatile memory executing on a controller of either the LPDRAM or non-volatile memory. In one or more embodiments, this allows the configuration of the LPDRAM to be self contained and occur under local control of the controller of the non-volatile memory (or LPDRAM) utilizing these pre-stored LPDRAM configuration routines, eliminating the need for the system designer to have to account for and configure the LPDRAM and its specific configuration and/or routines with the system processor or operating system. This simplifies the design process and increases system reliability by eliminating possible misconfiguration of the LPDRAM by the system designer and allow for increased forward compatibility of the system with future LPDRAM devices and/or revisions. New LPDRAM devices can be managed through use of updates to the non-volatile memory routines or use of an appropriate matching type of non-volatile device and do not require new routines to be configured and compiled into the OS.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A system comprising:
a non-volatile memory coupled to a bus through an interface configured to receive memory access addresses to the non-volatile memory from the bus and to output data from the non-volatile memory to the bus; and
a low power DRAM (LPDRAM) memory device coupled to the bus;
wherein the non-volatile memory is adapted to configure the LPDRAM memory device by,
configuring the LPDRAM memory device with a controller of the non-volatile memory;
wherein the controller is between a memory array of the non-volatile memory and its interface.

2. The system of claim 1, further comprising:
a host coupled to the bus, wherein the host is one of a processor and a memory controller.

3. The system of claim 1, wherein the non-volatile memory is adapted to locate the LPDRAM by one of a configured bus address, a data token placed on the bus, a query/response protocol, and a dedicated chip select line.

4. A system comprising:
a non-volatile memory coupled to a first bus through a first interface configured to receive memory access addresses to the non-volatile memory from the first bus and to output data from the non-volatile memory to the first bus, and further coupled to a second bus separate from the first bus; and
a low power DRAM (LPDRAM) memory device coupled to the first bus through a second interface configured to receive memory access addresses to the LPDRAM memory device from the first bus and to output data from the LPDRAM memory device to the first bus, and coupled to the second bus;
wherein the non-volatile memory is adapted to configure the LPDRAM memory device by,
configuring the LPDRAM memory device with a controller of the non-volatile memory and through communication with the LPDRAM memory device through the second bus;
wherein the second bus is a dedicated LPDRAM configuration bus coupled between the LPDRAM memory device and the non-volatile memory.

5. The system of claim 4, wherein the dedicated LPDRAM configuration bus is a serial bus.

6. The system of claim 1, wherein the controller is operable to configure self-refresh settings of the LPDRAM memory device.

7. The system of claim 1, wherein the non-volatile memory is one of a non-volatile memory device and a non-volatile memory subsystem.

8. The system of claim 1, wherein the bus is one of an asynchronous bus and a synchronous bus.

9. A low power DRAM (LPDRAM) memory device comprising:
a DRAM memory array;
an interface; and
a LPDRAM memory control state machine, wherein the LPDRAM memory control state machine is adapted to communicate with a non-volatile memory coupled to the LPDRAM memory device through the interface to read low power DRAM (LPDRAM) configuration routines stored in the non-volatile memory and configure the operational settings of the LPDRAM memory device using the read configuration routines;
wherein the LPDRAM memory control state machine is between the DRAM memory array and the interface.

10. The LPDRAM memory device of claim 9, wherein the interface is a first interface, and further comprising a second interface for communication of the LPDRAM memory device with a system bus, wherein the LPDRAM memory control state machine is further adapted to communicate with the non-volatile memory coupled to the LPDRAM memory device through a dedicated configuration bus separate from the system bus using the first interface.

11. The LPDRAM memory device of claim 9, wherein the LPDRAM memory device is configured with an address of the non-volatile memory or a specific chip select dedicated to the non-volatile memory.

12. The LPDRAM memory device of claim 9, wherein the LPDRAM memory device is adapted to locate the non-volatile memory by placing a token on a bus that the non-volatile memory is programmed to recognize and respond to, or initiating a query/response protocol.

13. A system comprising:
a non-volatile memory coupled to a bus through an interface, and comprising a controller and a memory array, wherein the interface is configured to receive memory access addresses to the non-volatile memory from the bus and to output data from the non-volatile memory to the bus, and wherein the controller is between the interface and the memory array of the non-volatile memory; and
a low power DRAM (LPDRAM) memory device coupled to the bus;
wherein the controller is adapted to read a routine from the non-volatile memory and to configure the LPDRAM memory device by executing the routine.

14. The system of claim 13, wherein the controller comprises either a control circuit or a state machine.

15. The system of claim 13, wherein the controller is further adapted to communicate with the LPDRAM memory device through the bus to configure at least one setting selected from a group consisting of low power mode operation, refresh style, voltage level selection, stand-by mode operation, and memory timing.

16. The system of claim 13, wherein the refresh style is selected from a group consisting of interleaved, partial column, full array, and bank refresh.

17. The system of claim 13, wherein the bus is a synchronous bus.

18. A system comprising:
a non-volatile memory coupled to a system bus through an interface, and comprising a controller and a memory array, wherein the interface is configured to receive memory access addresses to the non-volatile memory from the system bus and to output data from the non-volatile memory to the system bus, wherein the controller is between the interface and the memory array of the non-volatile memory, and wherein the non-volatile memory is further coupled to a second bus; and
a low power DRAM (LPDRAM) memory device coupled to the system bus and coupled to the second bus;
wherein the system bus is shared with a host of the system;
wherein the second bus is a dedicated configuration bus separate from the system bus; and
wherein the controller is adapted to read a routine from the non-volatile memory and to configure the LPDRAM memory device by executing the routine.

19. The system of claim 18, wherein the dedicated configuration bus is a single conductor based serial bus.

20. A low power DRAM (LPDRAM) memory device comprising:
a DRAM memory array;
a controller;
a first interface for communication of the LPDRAM memory device with a system bus, the first interface configured to receive memory access addresses to the LPDRAM memory device and to output data from the DRAM memory array; and
a second interface for communication of the LPDRAM memory device with a configuration bus separate from the system bus, the second interface configured to receive LPDRAM configuration routines for the LPDRAM memory device;
wherein the controller is adapted to communicate with a non-volatile memory coupled to the LPDRAM memory device through the configuration bus to read LPDRAM configuration routines stored in the non-volatile memory and to configure operational settings of the LPDRAM memory device using the read LPDRAM configuration routines.

* * * * *